United States Patent

Tenten

[11] Patent Number: 5,773,967
[45] Date of Patent: Jun. 30, 1998

[54] VOLTAGE REFERENCE WITH TESTING AND SELF-CALIBRATION

[75] Inventor: Wilfried Tenten, Gammertingen, Germany

[73] Assignee: Robert Bosch GmbH, Stuttgart, Germany

[21] Appl. No.: 836,447
[22] PCT Filed: Oct. 13, 1995
[86] PCT No.: PCT/DE95/01409
  § 371 Date: May 2, 1997
  § 102(e) Date: May 2, 1997
[87] PCT Pub. No.: WO96/14613
  PCT Pub. Date: May 17, 1996

[30] Foreign Application Priority Data

Nov. 5, 1994 [DE] Germany ............ 44 39 707.0

[51] Int. Cl.$^6$ .............. G05F 3/16; G11C 16/04
[52] U.S. Cl. ............ 323/313; 323/314; 365/189.09
[58] Field of Search .................. 323/313, 312, 323/315, 275, 280, 310, 907, 19; 307/491; 327/310, 306; 365/189.09

[56] References Cited

U.S. PATENT DOCUMENTS 5,229,710  7/1993  Kraus et al. ............... 323/313
5,247,241  9/1993  Ueda .......................... 323/312

*Primary Examiner*—Peter S. Wong
*Assistant Examiner*—Rajnikant B. Patel
*Attorney, Agent, or Firm*—Kenyon & Kenyon

[57] ABSTRACT

According to the invention, a voltage reference, i.e. a process for tuning a voltage reference, is proposed with self-monitoring and self-calibration. Use is made preferably of a band-gap reference source. The voltage reference is provided preferably with semiconductor switches with which the temperature coefficient is adjusted in a test cycle by parallel switching of resistances which alters the gain factor. Self-monitoring can be carried at any time and as often as desired, as can self-calibration. Control of the switch for the self-monitoring and self-calibration of the voltage reference is done using a matrix controlled by a microcomputer with an appropriate control program.

10 Claims, 5 Drawing Sheets

VOLTAGE REFERENCE WITH TESTING AND SELF-CALIBRATION

FIELD OF THE INVENTION

The present invention relates to a voltage reference of the type called a band gap.

BACKGROUND INFORMATION

Voltage references are commercially available in a wide range as integrated circuits. Their temperature gradients are calibrated during manufacture to specific tolerance parameters to compensate for a physically dictated temperature coefficient. Aging, however, can eliminate the calibration to the extent that the reference will, in certain circumstances, yield a voltage not allowed for by the downstream circuitry. The result can be an increased functional risk to the downstream circuitry.

SUMMARY OF THE INVENTION

The voltage reference in accordance with the present invention features the advantage that it can be repeatedly tested at any time throughout its life. Another advantage is that the repeated testing can be accompanied by repeated self-calibration. The voltage leaving the reference will accordingly be very reliable, and defects and aging phenomena can be detected and eliminated.

The self-testing and/or self-calibration can be carried out with simple switches, preferably MOS switches, which is a particular advantage. These switches are inactive and will not affect the voltage reference during normal operation. At prescribed times, when the operating voltage is applied or during demands advanced by the controls for example, the switches are activated by a prescribed control program that initiates the self-testing and/or self-calibration.

When an operations amplifier is employed, the temperature coefficient can be simply adjusted by means of a voltage divider. To compensate the temperature coefficient, at least one resistor is variable. This can be accomplished by, for instance, varying the feedback resistance with additional parallel resistors. The parallel circuit can be represented by programmable resistance networks or current networks. Since the MOS switches employed during calibration are not ideal, however, but have a finite ON resistance, it is simple to detect the situation with two MOS switches in parallel. The effect of the switches can then be determined to advantage by calculation.

Especially appropriate for this compensation is an embodiment of the present invention using operations amplifiers to switch a band-gap reference source. The same circuitry is appropriate for use with low battery voltage.

DETAILED DESCRIPTION

Figure 1:
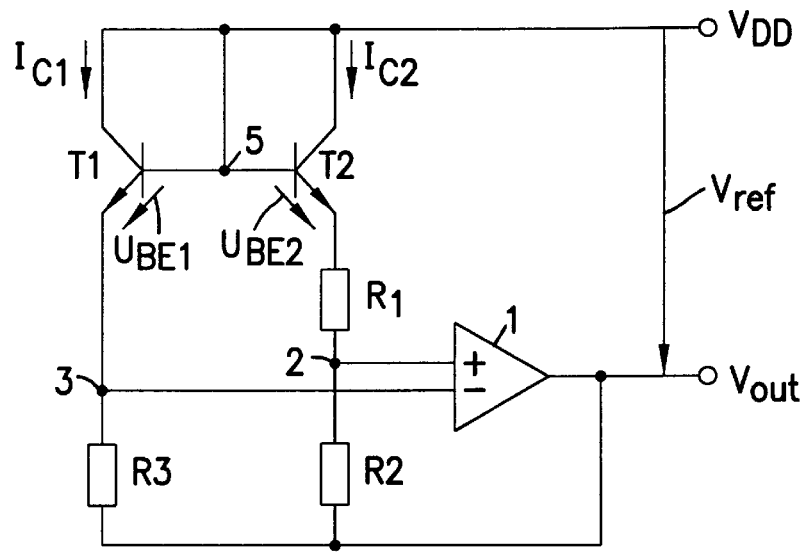
FIG. 1 illustrates a band-gap voltage reference.

FIG. 1 illustrates a voltage reference in the form of a band gap reference. Band-gap voltage-reference sources are in themselves known. They basically employ the forward voltage in a diode or the base-emitter voltage of a bipolar transistor as the voltage reference. The drawback of this reference voltage, however, when working with silicon bipolar transistors, is that it can have a temperature coefficient of approximately −2 mV/K. The circuits are accordingly designed to compensate the negative temperature coefficient with a positive coefficient of the same size. The operations amplifier 1 illustrated FIG. 1 is supplied from a current-level circuit in the form of two bipolar transistors T1 and T2, of the npn conductivity type for example. There is a voltage divider with resistors R1 and R2 in the emitter-current path of transistor T2. The middle tap of the voltage divider extends to the node 2 at the non-inverting input terminal (+) of operations amplifier 1. There is a resistor R3 in the emitter-current path of transistor T1. Resistor R3 extends to the node 3 at the inverting input terminal (−) of operations amplifier 1. The circuit is provided with supply voltage $V_{DD}$ and $V_{SS}$. A reference voltage $V_{ref}$ can be obtained between terminals VDD and the output terminal $V_{OUT}$ of operations amplifier 1. If pnp transistors were employed, the band-gap output would be stable in relation to $V_{SS}$. Output terminal $V_{OUT}$ is connected to the second connections of resistors R3 and R2. This circuit is preferably an integrated circuit, transistors T1 and T2 being bipolar, and the other components being integrated in CMOS technology, for example. Additionally, the operations amplifier may also be integrated using MOS technology.

The transistors T1 and T2 illustrated in FIG. 1 are driven by various collector currents $I_{C1}$ and $I_{C2}$. The result, depending on the temperature from the two base-emitter voltages of transistors T1 and T2, is a temperature coefficient that opposes temperature voltage $U_T$=87 $\mu$V/K. A specific amplification factor can be employed to amplify temperature voltage $U_T$ such that the circuit will assume a defined temperature coefficient. This coefficient can be negative, positive or even zero. When it is zero, the band-gap condition will be fulfilled, meaning that the reference source is temperature-independent.

The following equations describe the condition for the two diodes. The base-emitter voltage $V_{BE1}$ and $V_{BE2}$ for each transistor T1 and T2, respectively, is, due to the physical parameters, $$V_{BE1} = U_T \times \ln \frac{I_{C1}}{AT^X} \quad (1)$$

and $$V_{BE2} = U_T \times \ln \frac{I_{C2}}{AT^X} \quad (2)$$

wherein A is the emitter area and X the temperature coefficient of the two transistors T1 and T2.

The voltage drop across resistor R1 is, in terms of circuit technology, $$V_{R1} = \Delta V_{BE} = V_{BE2} - U_{BE1} = U_T * \ln \frac{I_{C1}}{I_{C2}} = U_T * \ln \frac{R2}{R3} \quad (3)$$

From this equation is derived that for the band-gap condition:

$$V_{ref} = V_{BE2} + U_T * \left(1 + \frac{R2}{R1} \times \ln\frac{R2}{R3}\right) \quad (4)$$

The term at $U_T$ represents the aforementioned amplification factor. Analysis of this equation will reveal that the factor term comprises only resistance relationships and, furthermore, that resistance R2 is in each numerator inside the parentheses. If this situation is exploited, by using a CMOS technology for instance, switches can be inserted into the non-conducting paths of the operations amplifier 1 employed within this assembly so as to act either with the ratio R2/R1 as a non-inverting amplifier, or with R2 and R3 in parallel as, again in terms of R1, a non-inverting operations amplifier. It will be evident from FIG. 2 that the amplification depends on the ratio R2/R1 in operations amplifier 1. The resistor R2 in the feedback branch illustrated in FIG. 3 is in parallel with another resistor R3x. The amplification factor for temperature voltage $U_T$ is accordingly constructed from the ratio of parallel circuit R2 and R3x to resistor R1, meaning that the output voltage from operations amplifier 1 can be represented by the equations $$V_{OUT1} = V_{IN} * \left(1 + \frac{R2}{R1}\right) \quad (5)$$

and $$V_{OUT2} = V_{IN} * \left(1 + \frac{(R2 * R3x)/(R2 + R3x)}{R1}\right). \quad (6)$$

Figure 4:
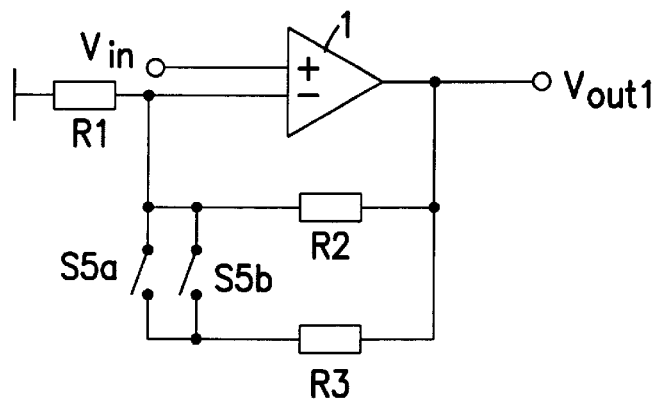
FIG. 4 illustrates a third circuit diagram of the operations amplifier.

Resistor R3x includes a resistor R3 along with the two parallel resistances afforded by switches S5a and S5b, which are in series with resistor R3 as illustrated in FIG. 4. Since switches S5a and S5b are transistors, CMOS transistors for example, their resistance cannot be neglected. The two switches S5a and S5b are the equivalent of two equal transistors. They are closed in sequence. The output voltage from operations amplifier 1 is measured for each operating position of switches S5a and S5b. The magnitude of the resistance is measured not as an absolute value but as a relationship between both results. The equations $$F1 = \frac{R2 * (R3 + S5a)}{R2 + R3 + S5a} \quad (7)$$

and $$F2 = \frac{R2 * (R3 + 0.5\, S5a)}{R2 + R3 + 0.5\, S5a} \quad (8)$$

represent the resistances of the switches S5a and S5b.

The resistance afforded by switch S5a can be calculated from these equations because factors F1 and F2 can be measured employing Equation (5). F1 and F2 are simplified representations of Equation (6), where $$V_{OUT2} = V_{IN}(1+F1)$$

and $$V_{OUT2} = V_{IN}(1+F2).$$

Figure 2:
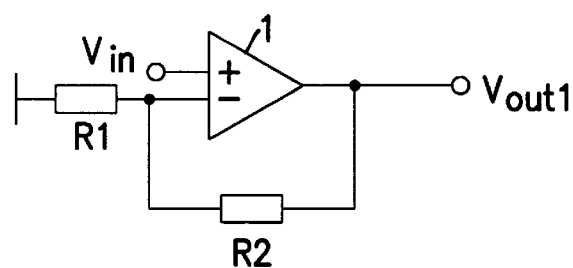
FIG. 2 illustrates an operations amplifier with negative feedback.
Figure 3:
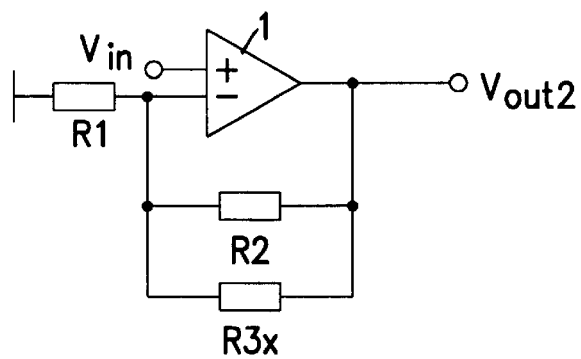
FIG. 3 illustrates another circuit diagram of the operations amplifier.

The value of resistor R3 can accordingly also be calculated by insertion into Equation (6) because the voltages $V_{OUT1}$ and $V_{OUT2}$ illustrated in FIGS. 2 and 3 can be detected with an analog-to-digital converter for example.

Figure 5:
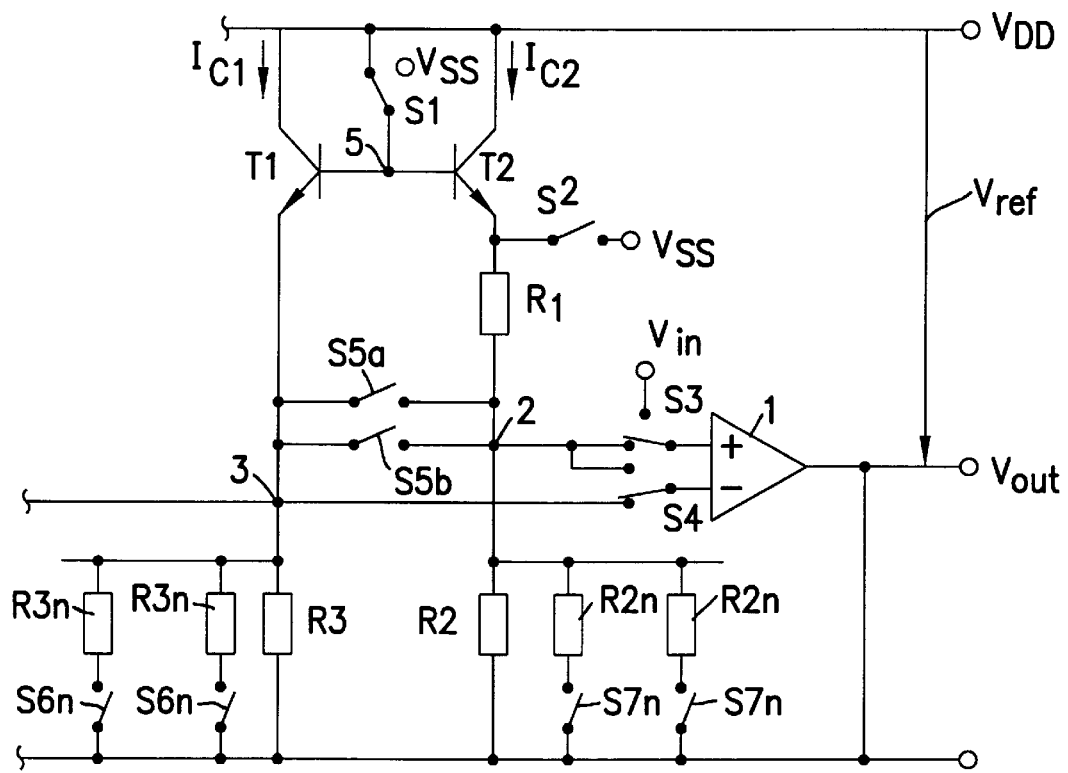
FIG. 5 illustrates the total circuitry involved in an embodiment of the present invention.
Figure 6:
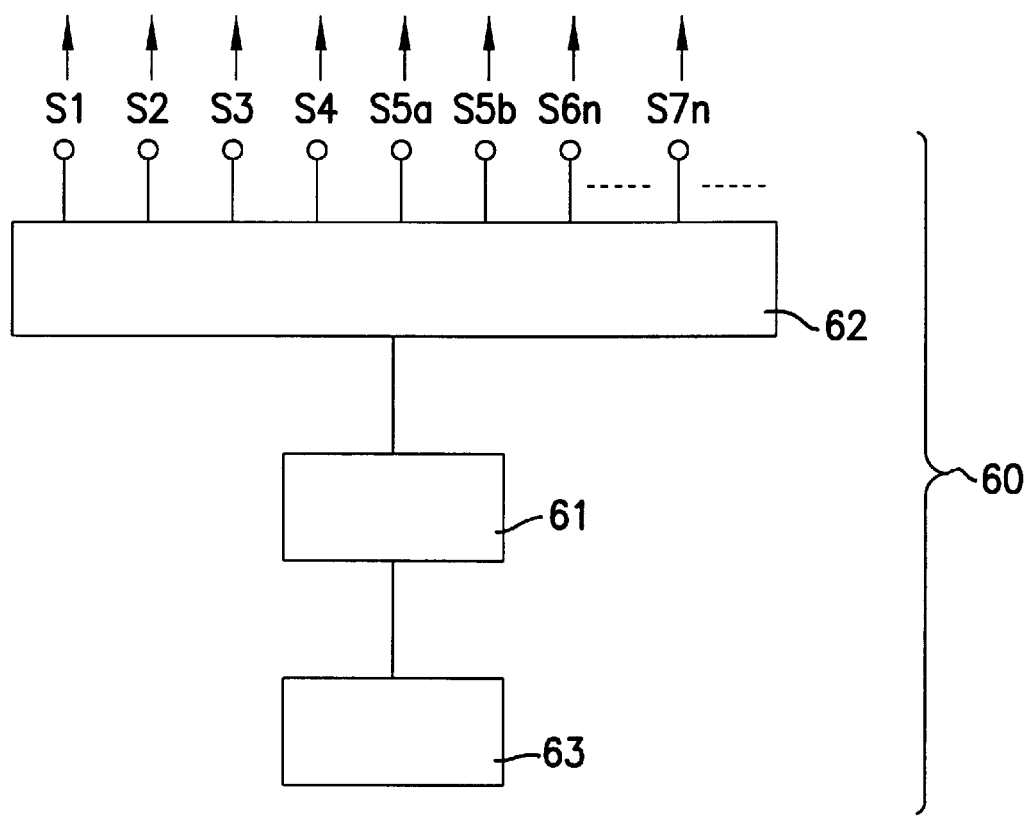
FIG. 6 is a flowchart.
Figure 7:
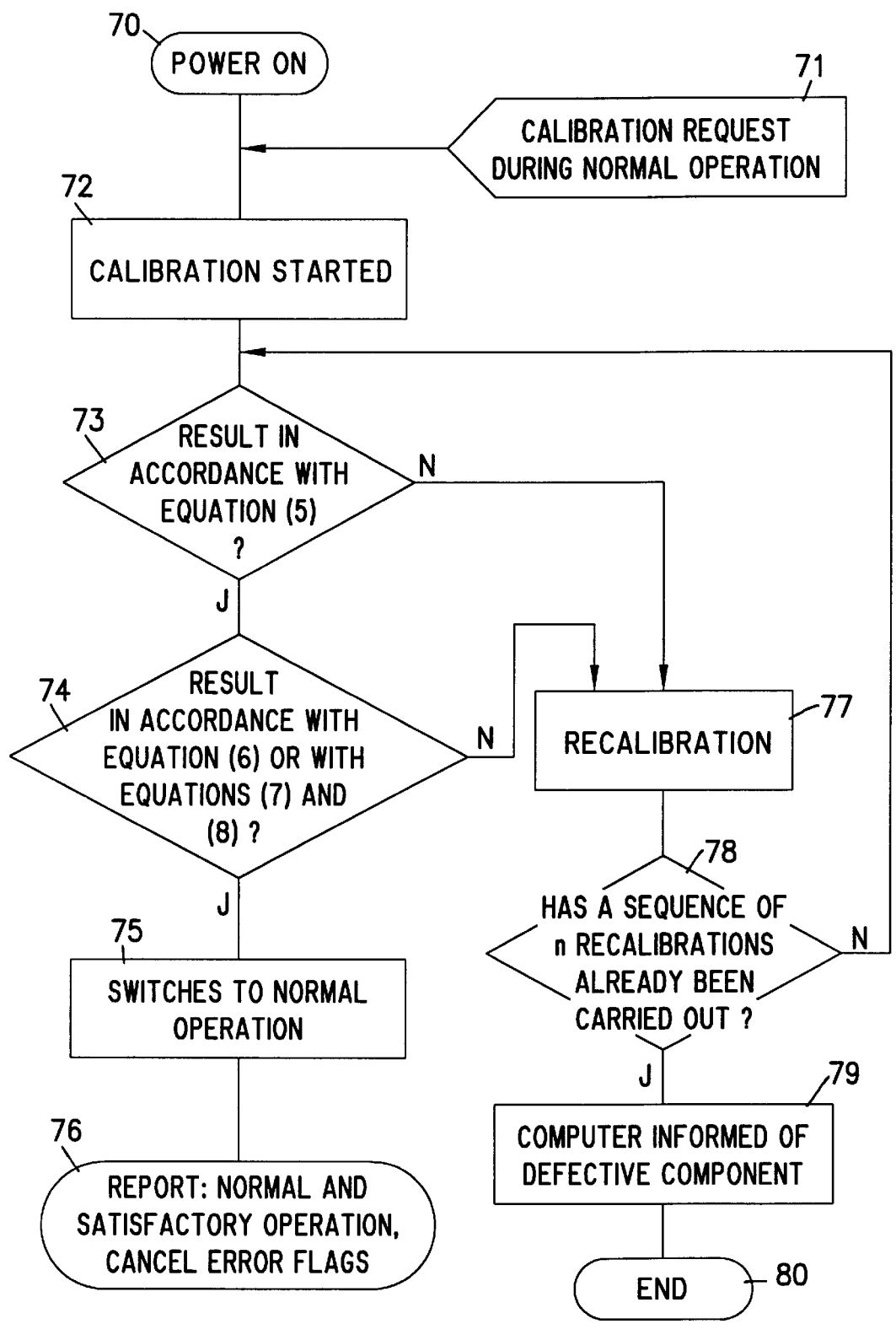
FIG. 7 is another flowchart.

FIG. 5 is a current-flow chart of an embodiment in accordance with the present invention wherein the reference source illustrated in FIG. 1 has been provided with switches S1–S7n. A first switch S1 diverts current obtained from a connection constituted by the node 5 between the bases of transistors T1 and T2 alternatively to connections $V_{DD}$ and $V_{SS}$. Switch S2 connects the emitter of transistor T2 at node 4 to connection $V_{SS}$. A third switch S3 connects the non-inverting connection (+) of the operations amplifier 1 alternatively to node 2 or to connection $V_{IN}$. Node 2 is the midpoint between resistors R1 and R2. Switch S4 alternatively connects the inverting connection (-) of the operations amplifier 1 to node 2 or node 3. Node 3 is between the emitter of transistor T1 and resistor R3. Positioned in parallel between nodes 2 and 3 are two switches S5a and S5b. In parallel with resistors R2 and R3 respectively, pairs of resistors R2n and R3n can be engaged in parallel in the form of a cascade by way of switches S6n and S7n. These parallel resistors can be engaged in the form of calibrating resistors during compensation. Switches S1–S7n are transistors, preferably MOS or CMOS transistors. These switches can, as illustrated in FIG. 6, be controlled by way of their base input terminals by a matrix 62 with matching output terminals. The matrix is controlled by a microprocessor 61. The processor program is stored in a memory 63. How the procedure works in normal operation and during calibration will now be specified with reference to FIGS. 7 and 8.

When the voltage reference is operating normally as illustrated in FIG. 5, switch S1 is in communication with terminal $V_{DD}$, switch S2 is open, and the third switch S3 is switched to node 2. The fourth switch S4 similarly connects node 3 to the inverting input terminal (-) of operations amplifier 1. Switches S6n and S7n are, depending on the calibration, partly open or closed. Switches S5a and S5b are open.

The voltage reference can be replaced by a source of reference current in another version of the present invention, in which case the testing and calibration procedures will be analogous. How the system operates during calibration and subsequent to introduction of the operating voltage will now be specified with reference to FIG. 7.

Operating voltage is introduced at position 70 (Power on), with calibration commencing at position 72. A calibration request can, however, also be received during normal operation from position 71 as will be specified hereinafter with reference to FIG. 8. Measurement of output voltage $V_{OUT1}$ commences once calibration has started, and the result is tested for plausibility in accordance with Equation (5) at position 73. If it passes this test, the result is tested at position 74 in relation to Equation (6) or to Equations (7) and (8). If the results are satisfactory, switches S1, S2, S3, S4, S5a, S5b, S6n, and S7n are switched to normal operation at position 75. At position 76 a report is issued to the controls that normal operation is under way and satisfactory. Any error flag that might have been set is then canceled.

When one of the tests conducted at positions 73 and 74 is unsatisfactory, recalibration is conducted at position 77, with one or both of the pairs of switches S6n and S7n closed to engage resistors R3n or R2n or both in parallel. At position 78 a test is conducted to determine whether a prescribed number of calibration cycles has been carried out in sequence. If so, a message is issued at position 78 that the voltage reference is defective. The program terminates at position 80. If only one test is conducted at position 78 for instance, the cycle will be repeated with the inquiry at position 73, testing the error once again.

Figure 8:
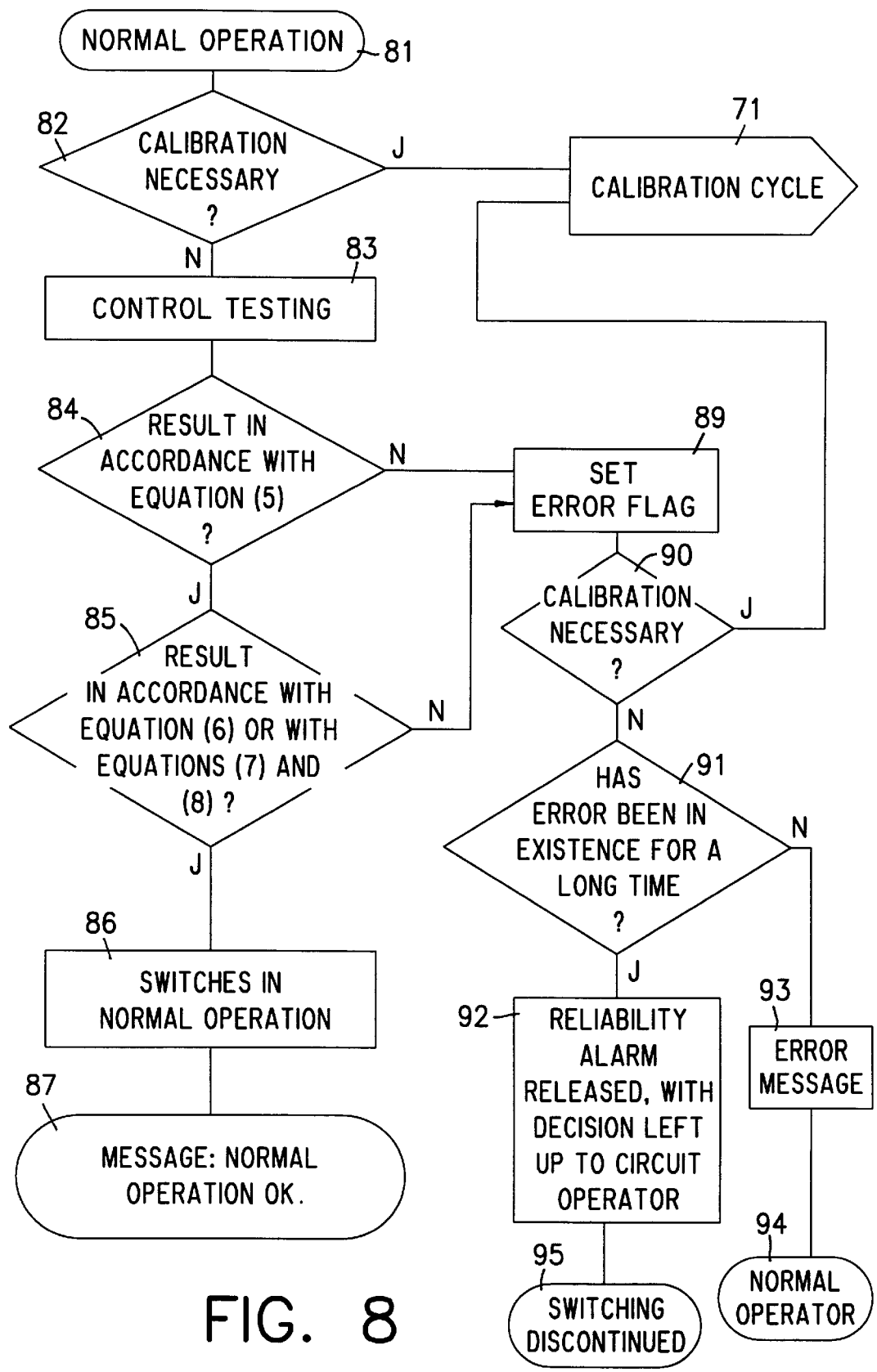
FIG. 8 is yet another flowchart.

FIG. 8 illustrates the testing sequence that occurs during normal operation, starting at position 81. If calibration is determined to be necessary at position 82, the program will skip at position 71 to the calibration cycle specified with reference to FIG. 7. If no calibration is necessary, a control test will be initiated at position 83. If a test conducted at position 84 indicates that the result is in accordance with Equation (5), a test for compliance with either Equation (6) or Equations (7) and (8) is conducted at position 85. If these tests are satisfactory, the switches will be returned to normal operation at position 86, and a message to that effect will be issued at position 87.

If the results of the tests conducted at positions 84 and 85 are unsatisfactory, meaning that there is a defect, an error flag will be raised at position 89. A query as to whether calibration is necessary will be conducted at position 90. If calibration is necessary, the program will skip back to the calibration cycle at position 71. Otherwise, a query as to whether the error has been in existence for a long time will be conducted at position 91. If this is the case, a reliability alarm will be emitted at position 92, allowing the operator of the circuitry to decide how to interpret it. The switching process might be discontinued at position 95 for example.

If, on the other hand, the error is determined at position 91 to be recent, its existence will be announced at position 93. In this event, normal operation will be restored at position 94.

What is claimed is:

1. A voltage reference circuit providing a voltage and having a temperature coefficient comprising:
    at least one input resistor;
    at least one feedback resistor;
    at least one operations amplifier having an inverting input terminal and a non-inverting input terminal, the at least one operations amplifier being switched to function as a non-inverting amplifier using the at least one input resistor and the at least one feedback resistor; and
    a plurality of switches performing at least one of a self-test and a self-calibration of the voltage reference circuit to compensate for the temperature coefficient of the voltage reference circuit during a service life of the voltage reference circuit, the plurality of switches including:
        a first switch having a first end connected to the non-inverting input terminal,
        a second switch having a first end connected to the inverting input terminal, and
        a third switch connected in parallel with a fourth switch, the third and fourth switches switching at least one calibration resistor in parallel to the at least one feedback resistor, wherein one of the third and fourth switches is activated before the other one of the third and fourth switches.

2. The voltage reference circuit according to claim 1, wherein the at least one operations amplifier is constructed using at least one of a MOS technology and a CMOS technology.

3. The voltage reference circuit according to claim 1, wherein the plurality of switches are transistor switches.

4. The voltage reference circuit according to claim 1, wherein the plurality of switches are at least one of MOS semiconductor transistor switches and CMOS semiconductor transistor switches.

5. The voltage reference circuit according to claim 1, wherein a first measurement of the voltage is determined when only the one of the third and fourth switches is activated, wherein a second measurement of the voltage is determined when the other one of the third and fourth switches is activated, and wherein a resistance of the third and fourth switches is determined as a function of a difference between the first measurement and the second measurement.

6. The voltage reference circuit according to claim 1, further comprising a microprocessor controlling the plurality of switches.

7. The voltage reference circuit according to claim 1, further comprising a circuit arrangement, wherein the circuit arrangement, the at least one input resistor, the at least one feedback resistor and the at least one operations amplifier are connected to form a band gap reference circuit.

8. A method for at least one of self-testing and self-calibrating a voltage reference circuit, the voltage reference circuit providing a voltage and having a temperature coefficient, the method comprising the steps of:
    switchably connecting a first base connection of a first transistor to a ground using a first switch;
    switchably connecting a second base connection of a second transistor to the ground using the first switch;
    switchably connecting a first emitter of the first transistor to the ground using a second switch;
    switchably connecting a second emitter of the second transistor to the ground using the second switch;
    switchably connecting a non-inverting input terminal of an operations amplifier to a first input voltage using a third switch;
    switchably connecting an inverting input terminal of the operations amplifier to a first node connected to an input resistor and a feedback resistor;
    switchably connecting a first calibration resistor in parallel with the feedback resistor by closing one of a fourth switch and a fifth switch;
    measuring a first voltage reference after closing the one of the fourth switch and the fifth switch;
    switchably connecting the first calibration resistor in parallel with the feedback resistor by closing the other one of the fourth switch and the fifth switch;
    measuring a second voltage reference after closing the other one of the fourth switch and the fifth switch; and
    switchably connecting at least one of a second calibrating resistor and a third calibrating resistor in parallel with at least one of the feedback resistor and the first calibration resistor to compensate for the temperature coefficient.

9. The method according to claim 8, further comprising the step of providing a supply voltage prior to the first connecting step, and wherein the voltage reference circuit is used with another subassembly in an integrated circuit.

10. The method according to claim 8, wherein the voltage reference circuit includes a voltage source.

* * * * *